United States Patent
Tucker et al.

(10) Patent No.: US 10,367,524 B2
(45) Date of Patent: Jul. 30, 2019

(54) SEMI-DYNAMIC, LOW LATENCY COMPRESSION

(71) Applicant: Intel Corporation, Santa Clara, CA (US)

(72) Inventors: Gregory B. Tucker, Chandler, AZ (US); James D. Guilford, Northborough, MA (US); Daniel F. Cutter, Maynard, MA (US); Vinodh Gopal, Westborough, MA (US); Wajdi K. Feghali, Boston, MA (US)

(73) Assignee: Intel Corporation, Santa Clara, CA (US)

( * ) Notice: Subject to any disclaimer, the term of this patent is extended or adjusted under 35 U.S.C. 154(b) by 57 days.

(21) Appl. No.: 15/496,562

(22) Filed: Apr. 25, 2017

(65) Prior Publication Data

US 2018/0310012 A1 Oct. 25, 2018

(51) Int. Cl.
*G06K 9/46* (2006.01)
*H03M 7/40* (2006.01)

(52) U.S. Cl.
CPC ..................................... *H03M 7/40* (2013.01)

(58) Field of Classification Search
CPC ............................. H04N 19/426; H04N 19/66
See application file for complete search history.

(56) References Cited

U.S. PATENT DOCUMENTS

2005/0104753 A1* 5/2005 Dror ................... H03M 7/3086
341/51
2017/0187388 A1* 6/2017 Satpathy ............. H03M 7/3082

OTHER PUBLICATIONS

"DEFLATE Compressed Data Format Specification—RFC1951", [Online]. Retrieved from the Internet: <URL: http://www.faqs.org/rfcs/rfc1951.html>, (Accessed Jul. 8, 2017), 15 pgs.
Gopal, Vinodh, et al., "High Performance DEFLATE Compression on Intel Architecture Processors", IA Architects Intel Corporation White Paper, (Nov. 2011), 15 pgs.
Huffmand, David A., "A Method for the Construction of Minimum Redundancy Codes", Proceedings of the I.R.E, vol. 40, No. 9, (Sep. 1952), 1098-1101.
Le, Thai, et al., "Intel ISA-L: Semi-Dynamic Compression Algorithms", Intel Tutorial, (Dec. 29, 2016), 14 pgs.
McIntyre, David R., "Data Compression Using Static Huffiuau Code-Decode Tables", Communications of the ACM, vol. 28, No. 6, (Jun. 1985), 612-615.
Ziv, Jacob, et al., "A Universal Algorithm for Sequential Data Compression", IEEE Transactions on Information Theory, IT-23 (3), (May 1977), 337-343.

* cited by examiner

*Primary Examiner* — Phuoc Tran
(74) *Attorney, Agent, or Firm* — Schwegman Lundberg & Woessner, P.A.

(57) ABSTRACT

Methods and apparatus are described by which data is compressed using semi-dynamic Huffman code generation. Embodiments generate symbol statistics over a portion of data. The symbol statistics are expanded to include all possible literals that could appear within the data. Any literal or reference added to the statistics may be given a frequency of one. The statistics are used to generate a semi-dynamic Huffman code. The entire data is then compressed using the semi-dynamic Huffman code.

25 Claims, 14 Drawing Sheets

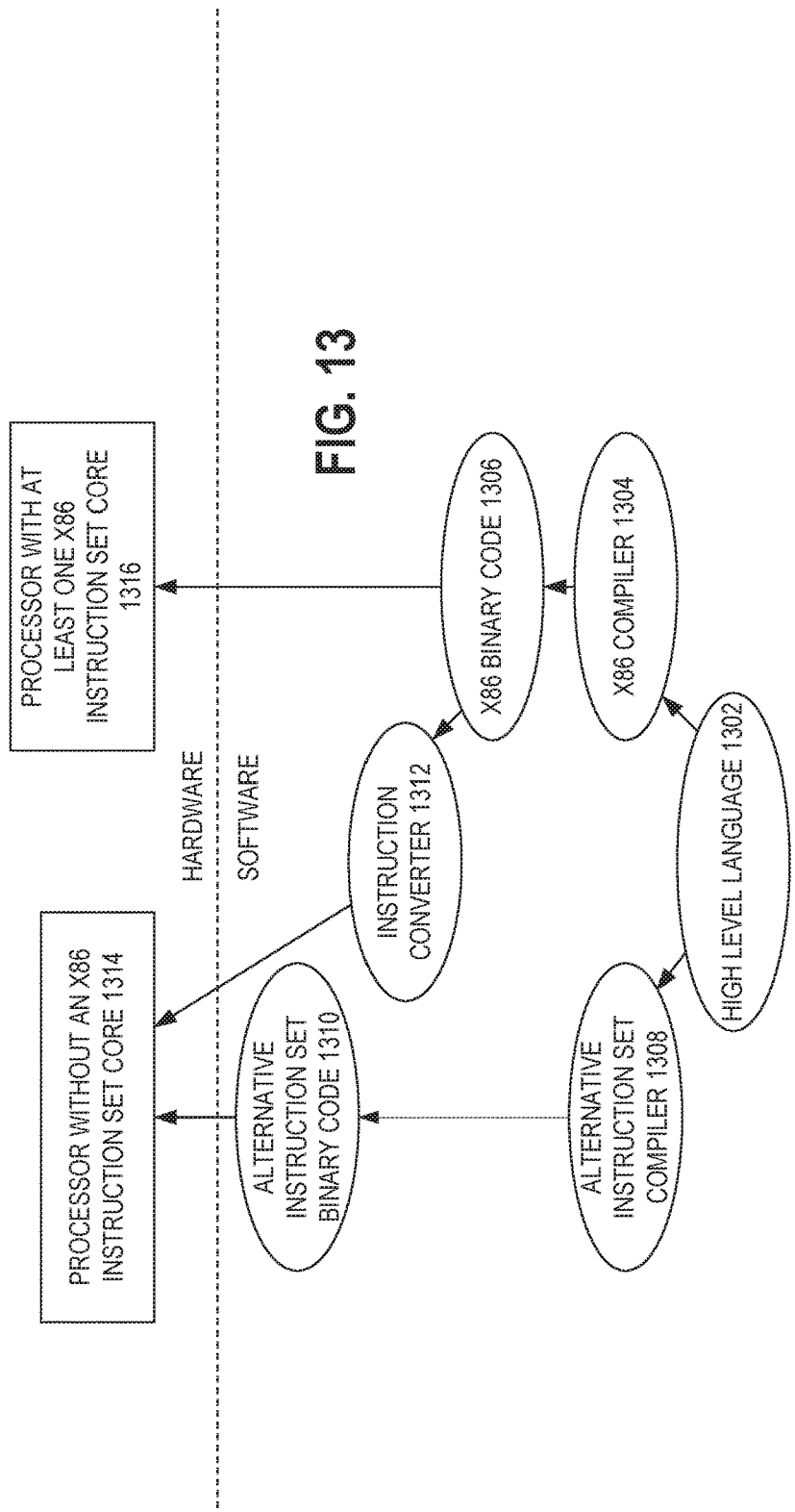

SEMI-DYNAMIC, LOW LATENCY COMPRESSION

TECHNICAL FIELD

Embodiments described herein relate generally to data compression. Some embodiments relate to improving the compression ratio of LZ77-based compression algorithms without requiring two passes through the data. Embodiments are implemented in hardware, software, or a mix of both hardware and software.

BACKGROUND

LZ77 is a lossless data compression algorithm. One algorithm that uses LZ77 is DEFLATE that is used with portable network graphics (PNG) files. The DEFLATE standard data format includes a series of blocks that correspond to successive blocks of input data. Each block is compressed using a combination of the LZ77 algorithm and Huffman coding. The LZ77 algorithm finds repeated substrings and replaces them with backward references (relative distance offsets). The LZ77 algorithm can use a reference to a duplicated string occurring in the same or previous blocks. For example, the LZ77 algorithm may use a window to find duplicated strings in previous data. In some implementations, the window may be up to 32 kilobytes (kb) in length. The compressed data consists of a series of elements of two types: literal bytes and pointers to replicated strings, where a pointer is represented as a pair <length, backward distance>. Huffman coding utilizes variable length codes to represent symbols such that frequent symbols get short codes and infrequent symbols get long codes, thereby representing the set of symbols compactly.

In DEFLATE, compression using dynamic Huffman codes does two passes through the data. The first pass analyzes the message block for symbol frequencies and constructs an optimal Huffman code for the data. Once the Huffman code has been generated, the data is processed in a second pass that performs substitution of symbols into the variable length prefix codes, which compresses the data. Performing two passes through the data constructs the optimal Huffman code for the data, but is costly for embedded hardware solutions that may have very limited on-chip memory and have very high processing throughput requirements. In addition, two passes through the data requires additional time compared to a single pass through the data.

LZ77 may also use a single pass through the data using a single, predefined, static Huffman code. Using the static Huffman code, however, is independent on the data being compressed. Accordingly, the compression ratio loses on average around 15% compared to LZ77 that uses dynamic Huffman codes based upon the data being compressed. Thus a compression hardware engine that optimizes for latency and throughput by producing all blocks using static Huffman codes will sacrifice a significant compression ratio.

One enhancement to using a single static Huffman code is to use four static trees that work well for a class of file. When a file is compressed, the header contains a code ID that determines which of the four static Huffman codes is used. This enhancement works well when the compressor and decompressor are aware of the header extensions and know a priori what static codes are used. This extension has some limitations. As this extension is not standard, the extension only works when both the compressor and the decompressor are aware of and use the enhancement. Once the static Huffman codes are defined, a legacy is created and the Huffman codes have to be supported and maintained. In addition, the four Huffman codes may not be optimal for other file types or application. Adding additional Huffman codes for different applications may also be difficult.

BRIEF DESCRIPTION OF THE DRAWINGS

FIG. 13 is a block diagram contrasting the use of a software instruction converter to convert binary instructions in a source instruction set to binary instructions in a target instruction set according to embodiments of the invention.

DETAILED DESCRIPTION

Figure 1:
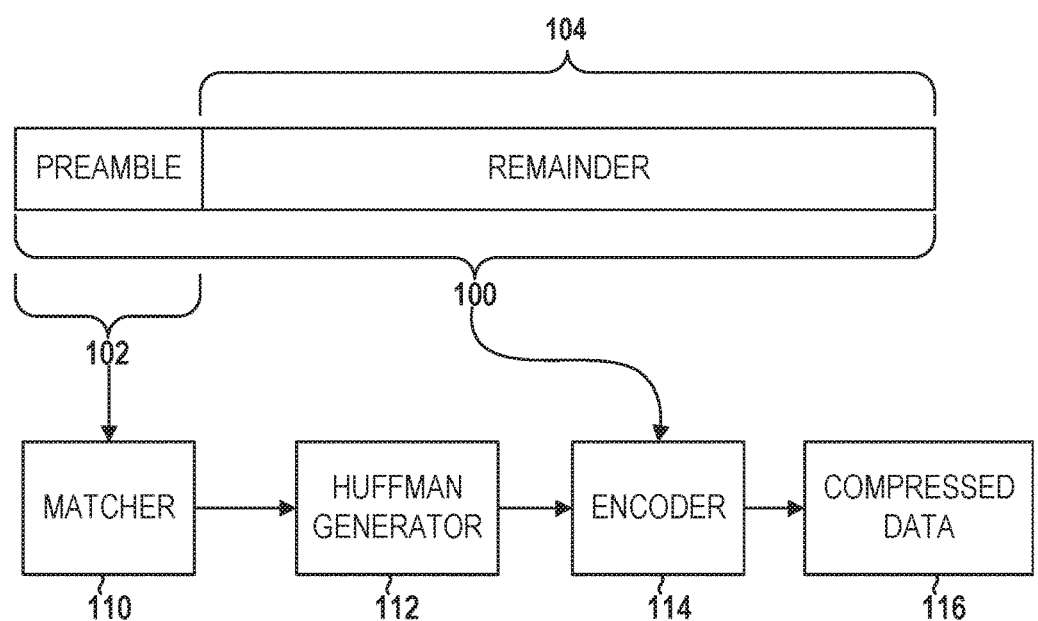
FIG. 1 illustrates a compression scheme according to some embodiments.

Currently, LZ77 data compression falls into two categories: dynamic statistics (dynamic Huffman codes) or static statistic (static Huffman codes). For dynamic statistics, LZ77 functions are constantly performing matching of input data and taking statistics on symbol frequencies (literals and distance/length match values). Due to the statistics of symbols, two passes through the data is required. The first pass collects the statistics and the second pass compresses the data. Dynamic statistics may result in a Huffman code that leads to a near optimal compression ratio for particular data. The time taken, however, can be much more compared to using static Huffman codes. In contrast, static codes have pre-set statistic tables based on expected statistics. These static tables do not require the statistics taking on symbol frequencies and therefore, result in faster performance. The increased performance, however, comes at the cost of compression ratios compared to the compression ratios of dynamic Huffman codes.

The present disclosure relates to compressions enhancements that do not require two passes through the data and are able to achieve better compression ratios compared to using static Huffman codes. Using statistics from a small portion of a chunk of data, a Huffman code may be generated for the entire chunk. The entire chunk of data may then be compressed using the Huffman code. The majority of the chunk, therefore, is only passed through once while the Huffman code used is dynamic in nature. In some embodiments, the preamble is processed twice while the rest and majority of the chunk of data is processed once. In various embodiments, the compression ratio is close to the full dynamic LZ77 algorithm while only processing the majority of data using a single pass.

In some embodiments, a file that is to be compressed is split into smaller chunks. For example, the file can be chunked into one megabyte chunks. In a first phase, a small segment of a chunk, a preamble or a training chunk, is processed similar to the full-dynamic LZ77 scheme. Symbol statistics are gathered for the preamble. In some embodiments, LZ77 matching is performed as part of the first phase. The symbols, however, may not be packed into compressed output in some embodiments. In an example, the training chunk is selected from within the chunk of data starting at some location within the chunk, rather than at the beginning.

In the second phase, the statistics gathered in the first phase are used to generate a Huffman code. In an example, the statistics can be statistics that are averaged over two or more chunks. The Huffman code is used to compress the entire chunk of data. As the statistics are generated from a smaller portion of the chunk of data, the statistics are not guaranteed to cover all literals and reference length/distances that are within the entire chunk of data. Accordingly, unlike in fully dynamic LZ77, the symbol statistics are extended to cover all symbols that may be within the chunk of data that were not present in the preamble. In some embodiments, the symbol frequency is set to one for any symbol that was not within the preamble. Once the statistics have been extended, a Huffman code may be generated from the extended statistics. Extending the statistics ensures that the Huffman code is complete.

The Huffman code may then be used to compress the entire chunk. The majority of the chunk, therefore, is compressed using only a single pass through the data. The single pass through the majority of data means that this compression scheme is faster than compression schemes that pass through the data two separate times. Further, because the Huffman code is generated from a portion of the chunk, the compression ratio is better than using predefined static Huffman codes. In addition, breaking a file into chunks allows the Huffman code to change as the content of the file changes. Therefore, this type of compression may be referred to as semi-dynamic compression.

In some embodiments, the one megabyte chunk of data is larger than the chunks of data used in fully dynamic Huffman encoding. Decompressing data, therefore, may also be faster given the larger chunks of data. Larger chunks of data means less processing time is spent loading Huffman codes to decompress data.

The compressed file may include a header specifying dynamic, rather than static, compression and also include a binary representation of the Huffman codes used to compress the data. This information allows any DEFLATE compliant decompressor to decompress the compressed data using the header data and the Huffman codes.

In various experiments, the Silesia data corpus was compressed using static Huffman codes, dynamic Huffman codes, precomputed tables, and various semi-dynamic schemes according to various embodiments.

| Compression Scheme | Compression Ratio |
|---|---|
| DEFLATE static Huffman Codes | 51.00% |
| Generic precomputed tables | 44.86% |
| Semi-dynamic-32k | 41.03% |
| Semi-dynamic-64k | 39.41% |
| Semi-dynamic-96k | 39.38% |
| Zlib-1 (Dynamic Huffman codes) | 36.62% |

In the above experiments, files were broken up into one megabyte chunks for the semi-dynamic embodiments. The preamble size was varied between 32 kilobytes (kb), 64 kb, and 96 kb. A smaller preamble results in less data that is processed twice, but also less statistics that are used to generate the Huffman codes. Thus, generally larger preambles results in better compression ratios but add processing time. In various embodiments, the preamble size is 5% or less of the chunk size.

In various embodiments, symbol statistics are generated based upon a small portion of a chunk. A Huffman code based upon the statistics are generated. The Huffman code is then used to process the entire chunk. Larger files can be broken into multiple chunks and each chunk processed separately. There are two different schemes that can semi-dynamically compress data.

FIG. 1 illustrates a compression scheme according to some embodiments. In this scheme, a chunk of data 100 is split into a preamble 102 and remainder data 104. The preamble 102 of the chunk of data 100 is processed twice. A matcher 110 processes the preamble 102 first. In some embodiments, LZ77 matching is done to generate tokens from the preamble 102. The tokens are histogrammed and then discarded. A Huffman code for the chunk of data 100 is generated from the histogrammed tokens using a Huffman code generator 112. The Huffman code is then used to compress both the preamble 102 and remainder data 104, such that the entire chunk of data 104 is compressed. This results in the remainder data 104 only being processed once and the preamble 102 being processed twice. In some embodiments, an encoder 114 is used to compress the chunk of data 100. For example, the encoder 114 can do LZ77 matching of the entire chunk of data 100 with the resulting tokens immediately being encoded using the Huffman code to generate compressed data 116. In some embodiments, the matcher 110 and the encoder 114 may be the same piece of hardware that operates in different modes.

Figure 2:
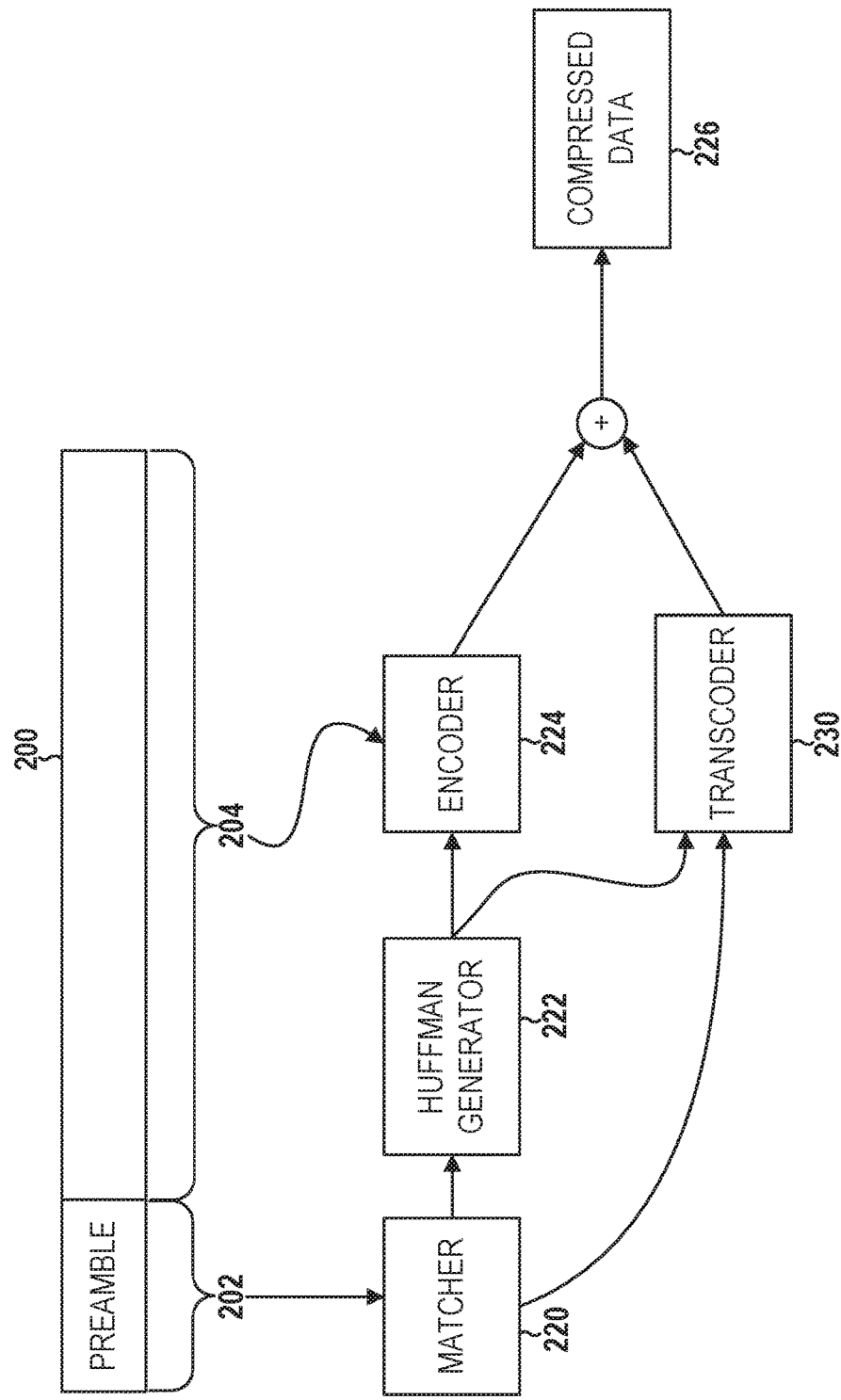
FIG. 2 illustrates another compression scheme according to some embodiments.

FIG. 2 illustrates another compression scheme according to some embodiments. In this scheme, a preamble 202 of a chunk of data 200 is processed only once. Accordingly, a single pass is done through the entire chunk of data 200. The preamble 202 undergoes LZ77 matching by a matcher 210 as done in the first scheme illustrated in FIG. 1. Rather than throw away the tokens, the tokens are saved. For example, the tokens may be written into a buffer. The tokens are used to generate a Huffman code for the chunk of data using a Huffman generator 212. The tokens from the preamble are transcoded, using a transcoder 230, using the Huffman codes. Remaining data 204 undergoes LZ77 matching and encoding using the Huffman codes via an encoder 214. In some embodiments, the matcher 210, the encoder 224, and the transcoder 230 may be the same piece of hardware that operates in different modes. In other embodiments, the transcoder 230 may be an additional Huffman transcoder that Huffman encodes the intermediate tokens from the preamble. The transcoded tokens and the encoded remainder data is then combined into compressed data 226 which is a lossless compression of the chunk of data 200. This scheme may have better performance compared to first scheme since there is only a single pass through the chunk of data 200. There is slightly more complexity, however, in that the preamble tokens are stored for later transcoding. In addition, memory is needed for buffering the tokens by the matcher.

Figure 3:
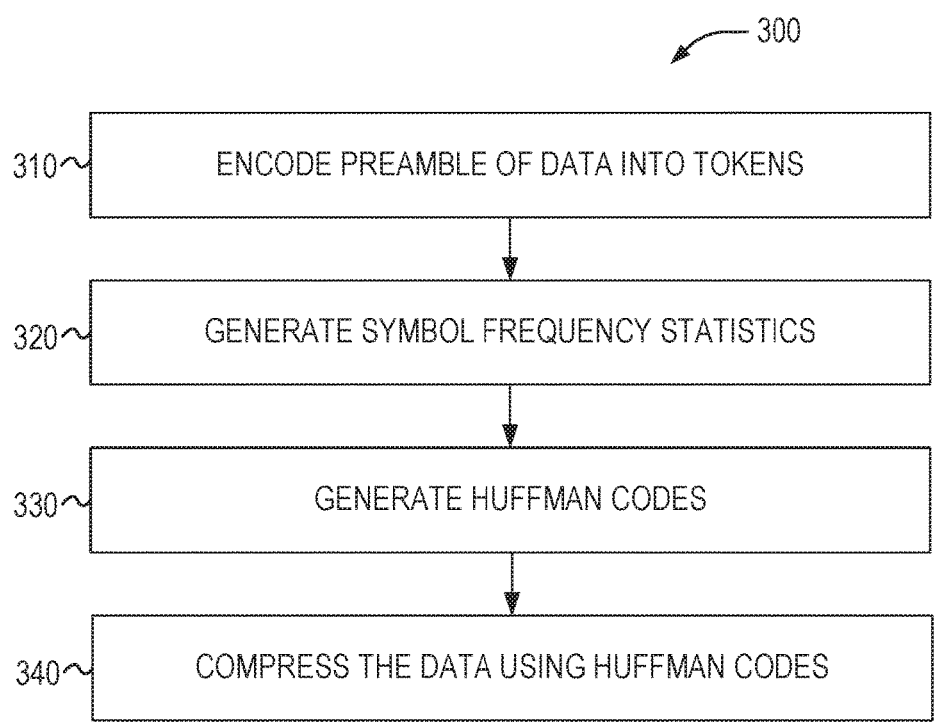
FIG. 3 is a flowchart showing one example of a process flow for compressing data according to some embodiments.

FIG. 3 is a flowchart showing one example of a process flow 300 for compressing data according to some embodiments. The process flow 300 may be executed on a computing device. At operation 310, a preamble of a chunk data is encoded into tokens. For example, LZ77 matching may be done to the data within the preamble. The preamble is substantially smaller, e.g., less than 5%, than the entire chunk of data. At operation 320, the tokens are used to generate symbol frequency statistics from the preamble. For example, the number of times a symbol appears within the preamble may be determined. As the symbol statistics are generated from the preamble and not from the entire chunk of data, the statistics are expanded to include all possible symbols that were not in the preamble. The frequency of such added symbols may be set to one. After adding these symbols, the statistics have complete coverage of all possible literals or references that may occur within the entire chunk of data. At operation 330, a Huffman code for the chunk of data is generated using the expanded symbol statistics. At operation 340, the chunk of data is compressed using the generated Huffman code. In some embodiments, the preamble is compressed during this operation. In other embodiments, only the non-preamble data, e.g., the remainder data, is compressed in this operation. In these embodiments, the preamble is compressed by storing the preamble tokens and transcoding those tokens using the generate Huffman code.

In various embodiments, portions of the compression schemes may be implemented in hardware and/or software. For example, in some embodiments, the Huffman table generation is done in software while the rest of the scheme, such as the LZ77 matching and encoding, is done in hardware. In some embodiments, the LZ77 matcher may operate in various different modes. A first mode may generate symbol frequencies only. This first mode may be used as part of the first compression scheme. A second mode generates both statistics, such as symbol frequencies and an intermediate LZ77 token stream. This mode may be used as part of the second compression schemes. A third mode does not generate statistics but encodes tokens, such as LZ77 tokens, into Huffman codes loaded into the matcher. This mode may be used as part of either the first or second compression schemes. As a further enhancement, memory that is used to store statistic histograms may be reused to hold either preamble statistics or the generated Huffman codes. This allows memory on current hardware components to be reused.

The lossless semi-dynamic compression scheme has a number of applications. For example, web servers may compress web data to send to browsers that decompress the data. If a web server does not support compression, a proxy compression appliance in front of the web server can be used to serve compressed data. In addition, databases and storage components may compress the data prior to storing the data. As another example, compression can be added to various network stacks of various protocols, such as, TLS/SSL, to support transmission of compressed data.

Example Machine Description

Figure 4:
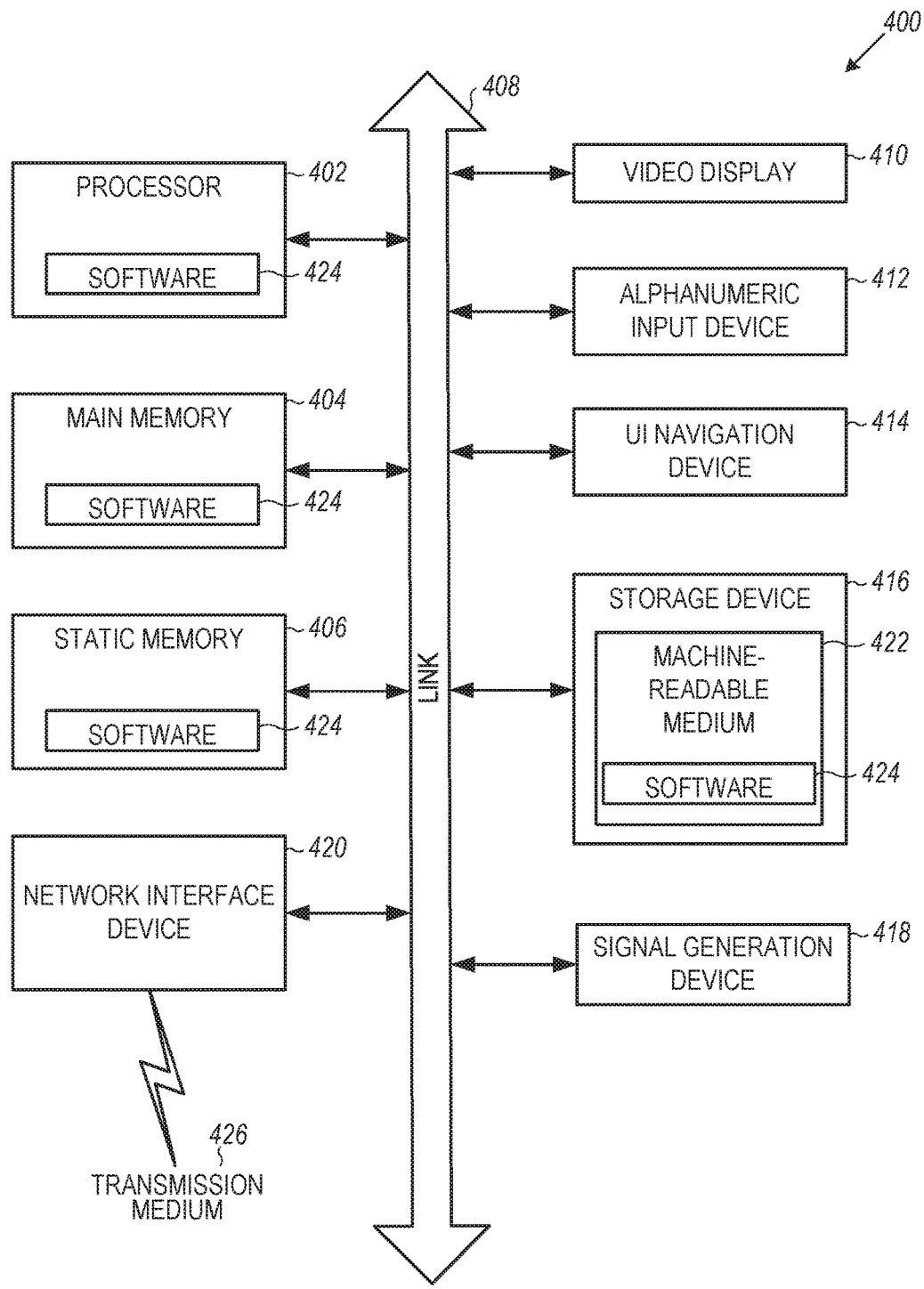
FIG. 4 illustrates a block diagram of a computing device, within which a set or sequence of instructions may be executed to cause the device to perform examples of any one of the methodologies discussed herein.

FIG. 4 illustrates a block diagram of computing device 400, within which a set or sequence of instructions may be executed to cause the device to perform examples of any one of the methodologies discussed herein. In alternative embodiments, the machine 400 may operate as a standalone device or may be connected (e.g., networked) to other machines. In a networked deployment, the machine 400 may operate in the capacity of a server machine, a client machine, or both in server-client network environments. In an example, the machine 400 may act as a peer machine in peer-to-peer (P2P) (or other distributed) network environment. The machine 400 may be a user equipment (UE), evolved Node B (eNB), Wi-Fi access point (AP), Wi-Fi station (STA), personal computer (PC), a tablet PC, a set-top box (STB), a personal digital assistant (PDA), a mobile telephone, a smart phone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate on, logic or a number of components, modules, or mechanisms. Modules are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

Machine (e.g., computer system) 400 may include a hardware processor 402 (e.g., a central processing unit (CPU), a graphics processing unit (GPU), a hardware processor core, or any combination thereof), a main memory 404 and a static memory 406, some or all of which may communicate with each other via an interlink (e.g., bus) 408. The machine 400 may further include a display unit 410, an alphanumeric input device 412 (e.g., a keyboard), and a user interface (UI) navigation device 414 (e.g., a mouse). In an example, the display unit 410, input device 412 and UI navigation device 414 may be a touch screen display. The machine 400 may additionally include a storage device (e.g., drive unit) 416, a signal generation device 418 (e.g., a speaker), a network interface device 420, and one or more sensors, such as a global positioning system (GPS) sensor, compass, accelerometer, or other sensor. The machine 400 may include an output controller 428, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 416 may include a machine readable medium 422 on which is stored one or more sets of data structures or instructions 424 (e.g., software) embodying or utilized by any one or more of the techniques or functions described herein. The instructions 424 may also reside, completely or at least partially, within the main memory 404, within static memory 406, or within the hardware processor 402 during execution thereof by the machine 400. In an example, one or any combination of the hardware processor 402, the main memory 404, the static memory 406, or the storage device 416 may constitute machine readable media.

While the machine readable medium 422 is illustrated as a single medium, the term "machine readable medium" may include a single medium or multiple media (e.g., a centralized or distributed database, and/or associated caches and servers) configured to store the one or more instructions 424.

The term "machine readable medium" may include any medium that is capable of storing, encoding, or carrying instructions for execution by the machine 400 and that cause the machine 400 to perform any one or more of the techniques of the present disclosure, or that is capable of storing, encoding or carrying data structures used by or associated with such instructions. Non-limiting machine readable medium examples may include solid-state memories, and optical and magnetic media. Specific examples of machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks. In some examples, machine readable media may include non-transitory machine readable media. In some examples, machine readable media may include machine readable media that is not a transitory propagating signal.

The instructions 424 may further be transmitted or received over a communications network 426 using a transmission medium via the network interface device 420 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, a Long Term Evolution (LTE) family of standards, a Universal Mobile Telecommunications System (UMTS) family of standards, peer-to-peer (P2P) networks, among others. In an example, the network interface device 520 may include one or more physical jacks (e.g., Ethernet, coaxial, or phone jacks) or one or more antennas to connect to the communications network 526. In an example, the network interface device 520 may include a plurality of antennas to wirelessly communicate using at least one of single-input multiple-output (SIMO), multiple-input multiple-output (MIMO), or multiple-input single-output (MISO) techniques. In some examples, the network interface device 520 may wirelessly communicate using Multiple User MIMO techniques. The term "transmission medium" shall be taken to include any intangible medium that is capable of storing, encoding or carrying instructions for execution by the machine 500, and includes digital or analog communications signals or other intangible medium to facilitate communication of such software.

Additional Notes and Examples

Example 1 is a system for compressing data, the system comprising: a matcher to: encode a preamble of data into a plurality of tokens, the data comprising the preamble and remainder data, each token comprising a symbol and a length of the symbol; and generate symbol frequency statistics indicating a number of times the symbol appears within the preamble of data; a Huffman table generator to generate a Huffman code from the plurality of tokens and the symbol frequency statistics; and an encoder to compress the remainder data using the Huffman code.

In Example 2, the subject matter of Example 1 optionally includes wherein the matcher adds a second plurality of tokens with a symbol frequency of one, wherein the plurality of tokens and the second plurality of tokens comprise all possible literals within the data.

In Example 3, the subject matter of any one or more of Examples 1-2 optionally include wherein the Huffman table generator adds a second plurality of tokens with a symbol frequency of one, wherein the plurality of tokens and the second plurality of tokens comprise all possible literals within the data.

In Example 4, the subject matter of Example 3 optionally includes wherein the encoder compresses the preamble of data.

In Example 5, the subject matter of any one or more of Examples 3-4 optionally include a buffer to store the plurality of tokens; and a transcoder to transcode the plurality of tokens using the Huffman codes, wherein the encoder compresses only the remainder data.

In Example 6, the subject matter of any one or more of Examples 1-5 optionally include wherein a file comprises a plurality of chunks of data, and wherein the data is one chunk of data.

In Example 7, the subject matter of Example 6 optionally includes wherein each chunk of data is compressed.

In Example 8, the subject matter of Example 7 optionally includes wherein at least two chunks of data are one megabyte in size.

In Example 9, the subject matter of any one or more of Examples 1-8 optionally include % of a size of the data.

In Example 10, the subject matter of Example 9 optionally includes 32 kilobytes.

In Example 11, the subject matter of any one or more of Examples 9-10 optionally include 64 kilobytes.

In Example 12, the subject matter of any one or more of Examples 9-11 optionally include 96 kilobytes.

In Example 13, the subject matter of any one or more of Examples 1-12 optionally include a server to provide the compressed data to a client.

In Example 14, the subject matter of Example 13 optionally includes wherein the server is a webserver and the client is a web browser.

In Example 15, the subject matter of any one or more of Examples 13-14 optionally include wherein the server is a proxy server that receives the data from a webserver and the client is a web browser.

In Example 16, the subject matter of any one or more of Examples 13-15 optionally include wherein the server encrypts the compressed data.

Example 17 is a machine-implemented method of compressing data, the method comprising: encoding a preamble of data into a plurality of tokens, the data comprising the preamble and remainder data, each token comprising a symbol and a length of the symbol; generating symbol frequency statistics indicating a number of times the symbol appears within the preamble of data; generating a Huffman code from the plurality of tokens and the symbol frequency statistics; and compressing the remainder data using the Huffman code.

In Example 18, the subject matter of Example 17 optionally includes generating the Huffman codes from a second plurality of tokens with a symbol frequency of one, wherein the plurality of tokens and the second plurality of tokens comprise all possible literals within the data.

In Example 19, the subject matter of Example 18 optionally includes wherein the encoder compresses the preamble of data.

In Example 20, the subject matter of any one or more of Examples 18-19 optionally include storing, in a buffer, the plurality of tokens; and transcoding the plurality of tokens using the Huffman codes, wherein the encoder compresses only the remainder data.

In Example 21, the subject matter of any one or more of Examples 17-20 optionally include wherein a file comprises a plurality of chunks of data, and wherein the data is one chunk of data.

In Example 22, the subject matter of Example 21 optionally includes wherein each chunk of data is compressed.

In Example 23, the subject matter of Example 22 optionally includes wherein at least two chunks of data are one megabyte in size.

In Example 24, the subject matter of any one or more of Examples 17-23 optionally include % of a size of the data.

In Example 25, the subject matter of Example 24 optionally includes 32 kilobytes.

In Example 26, the subject matter of any one or more of Examples 24-25 optionally include 64 kilobytes.

In Example 27, the subject matter of any one or more of Examples 24-26 optionally include 96 kilobytes.

Example 28 is at least one computer-readable medium, including instructions, which when executed by a machine, cause the machine to perform operations: encoding a preamble of data into a plurality of tokens, the data comprising the preamble and remainder data, each token comprising a symbol and a length of the symbol; generating symbol frequency statistics indicating a number of times the symbol appears within the preamble of data; generating a Huffman code from the plurality of tokens and the symbol frequency statistics; and compressing the remainder data using the Huffman code.

In Example 29, the subject matter of Example 28 optionally includes the operations further comprising generating the Huffman codes from a second plurality of tokens with a symbol frequency of one, wherein the plurality of tokens and the second plurality of tokens comprise all possible literals within the data.

In Example 30, the subject matter of Example 29 optionally includes wherein the encoder compresses the preamble of data.

In Example 31, the subject matter of any one or more of Examples 29-30 optionally include the operations further comprising: storing, in a buffer, the plurality of tokens; and transcoding the plurality of tokens using the Huffman codes, wherein the encoder compresses only the remainder data.

In Example 32, the subject matter of any one or more of Examples 28-31 optionally include wherein a file comprises a plurality of chunks of data, and wherein the data is one chunk of data.

In Example 33, the subject matter of Example 32 optionally includes wherein each chunk of data is compressed.

In Example 34, the subject matter of Example 33 optionally includes wherein at least two chunks of data are one megabyte in size.

In Example 35, the subject matter of any one or more of Examples 28-34 optionally include % of a size of the data.

In Example 36, the subject matter of Example 35 optionally includes 32 kilobytes.

In Example 37, the subject matter of any one or more of Examples 35-36 optionally include 64 kilobytes.

In Example 38, the subject matter of any one or more of Examples 35-37 optionally include 96 kilobytes.

Example 39 is an apparatus for compressing data, the apparatus comprising: means for encoding a preamble of data into a plurality of tokens, the data comprising the preamble and remainder data, each token comprising a symbol and a length of the symbol; means for generating symbol frequency statistics indicating a number of times the symbol appears within the preamble of data; means for generating a Huffman code from the plurality of tokens and the symbol frequency statistics; and means for compressing the remainder data using the Huffman code.

In Example 40, the subject matter of Example 39 optionally includes means for generating the Huffman codes from a second plurality of tokens with a symbol frequency of one, wherein the plurality of tokens and the second plurality of tokens comprise all possible literals within the data.

In Example 41, the subject matter of Example 40 optionally includes wherein the encoder compresses the preamble of data.

In Example 42, the subject matter of any one or more of Examples 40-41 optionally include means for storing, in a buffer, the plurality of tokens; and means for transcoding the plurality of tokens using the Huffman codes, wherein the encoder compresses only the remainder data.

In Example 43, the subject matter of any one or more of Examples 39-42 optionally include wherein a file comprises a plurality of chunks of data, and wherein the data is one chunk of data.

In Example 44, the subject matter of Example 43 optionally includes wherein each chunk of data is compressed.

In Example 45, the subject matter of Example 44 optionally includes wherein at least two chunks of data are one megabyte in size.

In Example 46, the subject matter of any one or more of Examples 39-45 optionally include % of a size of the data.

In Example 47, the subject matter of Example 46 optionally includes 32 kilobytes.

In Example 48, the subject matter of any one or more of Examples 46-47 optionally include 64 kilobytes.

In Example 49, the subject matter of any one or more of Examples 46-48 optionally include 96 kilobytes.

Example 50 is at least one machine-readable medium including instructions, which when executed by a machine, cause the machine to perform operations of any of the operations of Examples 1-49.

Example 51 is an apparatus comprising means for performing any of the operations of Examples 1-49.

Example 52 is a system to perform the operations of any of the Examples 1-49.

Example 53 is a method to perform the operations of any of Examples 1-49.

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, also contemplated are examples that include the elements shown or described. Moreover, also contemplate are examples using any combination or permutation of those elements shown or described (or one or more aspects thereof), either with respect to a particular example (or one or more aspects thereof), or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to suggest a numerical order for their objects.

The embodiments as described above may be implemented in various hardware configurations that may include a processor for executing instructions that perform the techniques described. Such instructions may be contained in a machine-readable medium such as a suitable storage medium or a memory or other processor-executable medium.

The embodiments as described herein may be implemented in a number of environments such as part of a wireless local area network (WLAN), 3rd Generation Partnership Project (3GPP) Universal Terrestrial Radio Access Network (UTRAN), or Long-Term-Evolution (LTE) or a Long-Term-Evolution (LTE) communication system, although the scope of the disclosure is not limited in this respect. An example LTE system includes a number of mobile stations, defined by the LTE specification as User Equipment (UE), communicating with a base station, defined by the LTE specifications as an eNB.

Antennas referred to herein may comprise one or more directional or omnidirectional antennas, including, for example, dipole antennas, monopole antennas, patch antennas, loop antennas, microstrip antennas or other types of antennas suitable for transmission of RF signals. In some embodiments, instead of two or more antennas, a single antenna with multiple apertures may be used. In these embodiments, each aperture may be considered a separate antenna. In some multiple-input multiple-output (MIMO) embodiments, antennas may be effectively separated to take advantage of spatial diversity and the different channel characteristics that may result between each of antennas and the antennas of a transmitting station. In some MIMO embodiments, antennas may be separated by up to $1/10$ of a wavelength or more.

In some embodiments, a receiver as described herein may be configured to receive signals in accordance with specific communication standards, such as the Institute of Electrical and Electronics Engineers (IEEE) standards including IEEE 802.11 standards and/or proposed specifications for WLANs, although the scope of the disclosure is not limited in this respect as they may also be suitable to transmit and/or receive communications in accordance with other techniques and standards. In some embodiments, the receiver may be configured to receive signals in accordance with the IEEE 802.16-2004, the IEEE 802.16(e) and/or IEEE 802.16(m) standards for wireless metropolitan area networks (WMANs) including variations and evolutions thereof, although the scope of the disclosure is not limited in this respect as they may also be suitable to transmit and/or receive communications in accordance with other techniques and standards. In some embodiments, the receiver may be configured to receive signals in accordance with the Universal Terrestrial Radio Access Network (UTRAN) LTE communication standards. For more information with respect to the IEEE 802.11 and IEEE 802.16 standards, please refer to "IEEE Standards for Information Technology—Telecommunications and Information Exchange between Systems"—Local Area Networks—Specific Requirements—Part 11 "Wireless LAN Medium Access Control (MAC) and Physical Layer (PHY), ISO/IEC 8802-11: 1999", and Metropolitan Area Networks—Specific Requirements—Part 16: "Air Interface for Fixed Broadband Wireless Access Systems," May 2005 and related amendments/versions. For more information with respect to UTRAN LTE standards, see the 3rd Generation Partnership Project (3GPP) standards for UTRAN-LTE, including variations and evolutions thereof.

Exemplary Register Architecture

Figure 5:
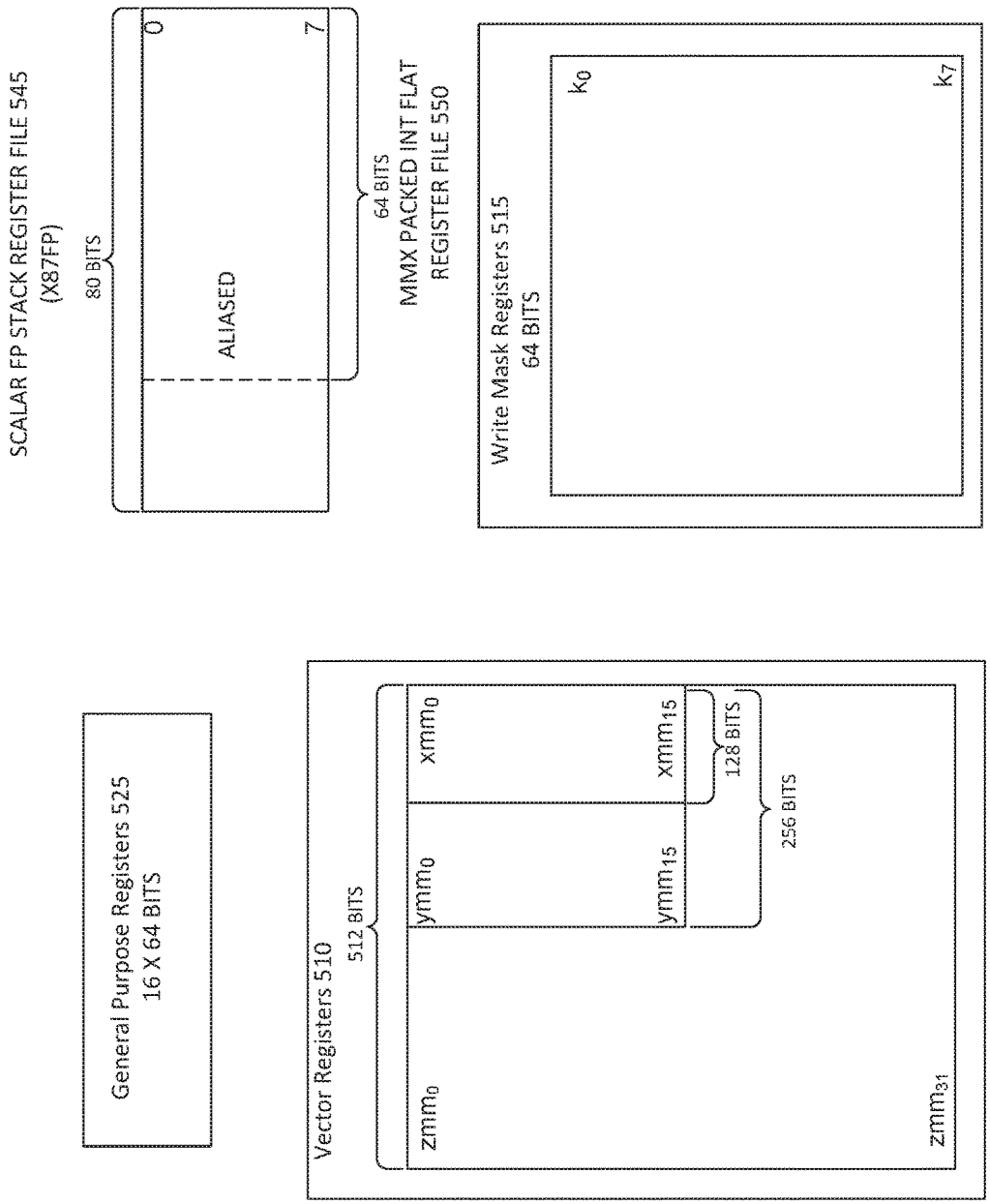
FIG. 5 is a block diagram of a register architecture according to one embodiment of the invention.

FIG. 5 is a block diagram of a register architecture 500 according to one embodiment of the invention. In the embodiment illustrated, there are 32 vector registers 510 that are 512 bits wide; these registers are referenced as zmm0 through zmm31. The lower order 256 bits of the lower 16 zmm registers are overlaid on registers ymm0-16. The lower order 128 bits of the lower 16 zmm registers (the lower order 128 bits of the ymm registers) are overlaid on registers xmm0-15.

Write mask registers 515—in the embodiment illustrated, there are 8 write mask registers (k0 through k7), each 64 bits in size. In an alternate embodiment, the write mask registers 515 are 16 bits in size. As previously described, in one embodiment of the invention, the vector mask register k0 cannot be used as a write mask; when the encoding that would normally indicate k0 is used for a write mask, it selects a hardwired write mask of 0xFFFF, effectively disabling write masking for that instruction.

General-purpose registers 525—in the embodiment illustrated, there are sixteen 64-bit general-purpose registers that are used along with the existing x86 addressing modes to address memory operands. These registers are referenced by the names RAX, RBX, RCX, RDX, RBP, RSI, RDI, RSP, and R8 through R15.

Scalar floating point stack register file (x87 stack) 545, on which is aliased the MMX packed integer flat register file 550—in the embodiment illustrated, the x87 stack is an eight-element stack used to perform scalar floating-point operations on 32/64/80-bit floating point data using the x87 instruction set extension; while the MMX registers are used to perform operations on 64-bit packed integer data, as well as to hold operands for some operations performed between the MMX and XMM registers.

Alternative embodiments of the invention may use wider or narrower registers. Additionally, alternative embodiments of the invention may use more, less, or different register files and registers.

Exemplary Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

Exemplary Core Architectures

In-Order and Out-of-Order Core Block Diagram

Figure 6A:
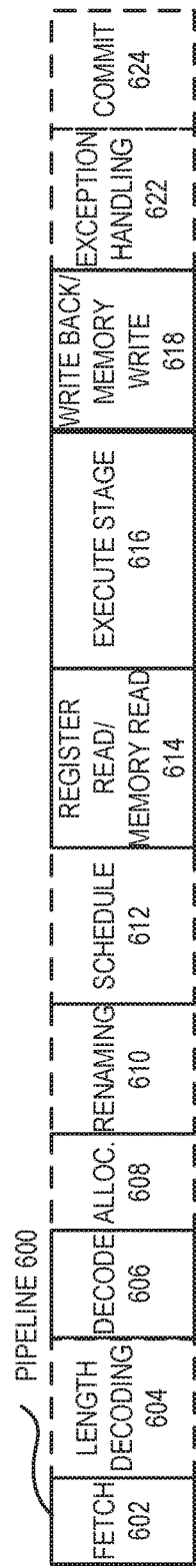
FIG. 6A is a block diagram illustrating both an exemplary in-order pipeline and an exemplary register renaming, out-of-order issue/execution pipeline according to embodiments of the invention.
Figure 6B:
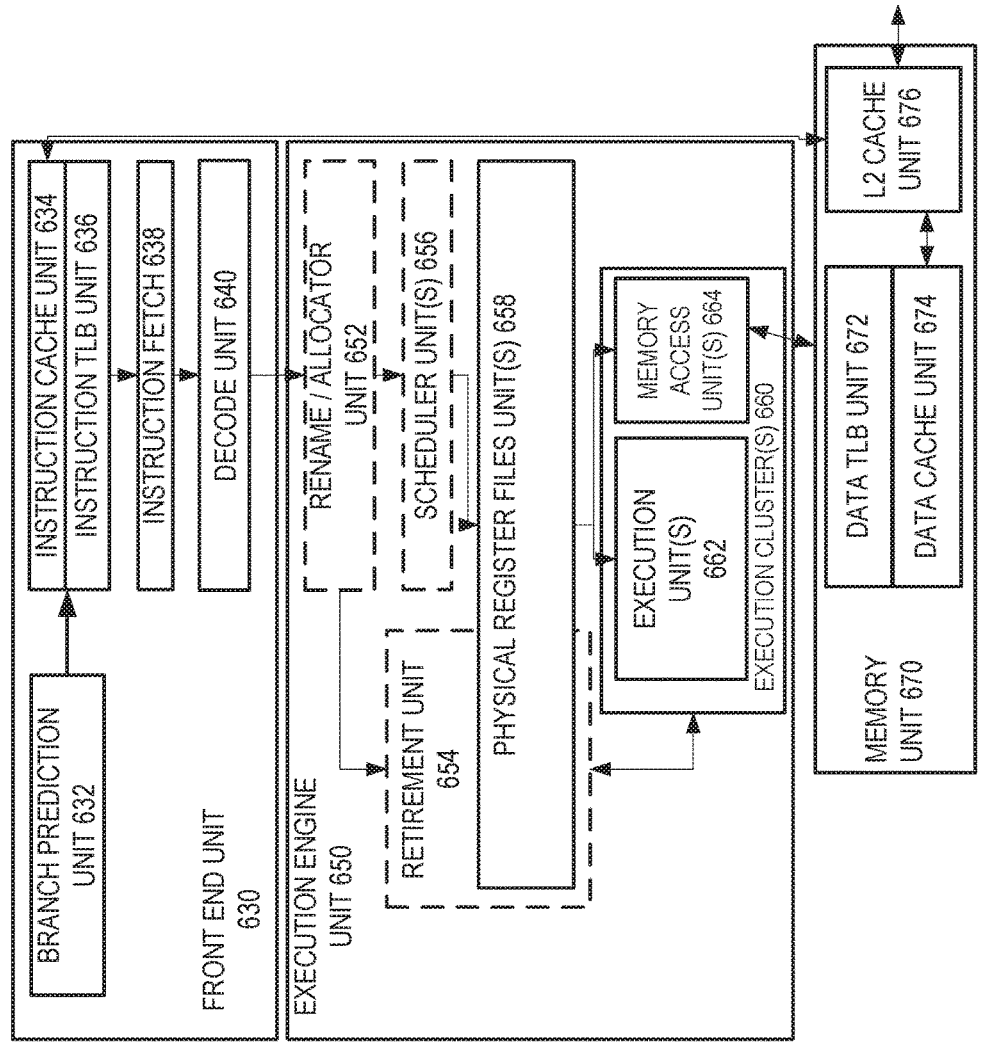
FIG. 6B is a block diagram illustrating both an exemplary embodiment of an in-order architecture core and an exemplary register renaming, out-of-order issue/execution architecture core to be included in a processor according to embodiments of the invention.

FIG. 6A is a block diagram illustrating both an exemplary in-order pipeline and an exemplary register renaming, out-of-order issue/execution pipeline according to embodiments of the invention. FIG. 6B is a block diagram illustrating both an exemplary embodiment of an in-order architecture core and an exemplary register renaming, out-of-order issue/execution architecture core to be included in a processor according to embodiments of the invention. The solid lined boxes in FIGS. 6A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 6A, a processor pipeline 600 includes a fetch stage 602, a length decode stage 604, a decode stage 606, an allocation stage 608, a renaming stage 610, a scheduling (also known as a dispatch or issue) stage 612, a register read/memory read stage 614, an execute stage 616, a write back/memory write stage 618, an exception handling stage 622, and a commit stage 624.

FIG. 6B shows processor core 690 including a front end unit 630 coupled to an execution engine unit 650, and both are coupled to a memory unit 670. The core 690 may be a reduced instruction set computing (RISC) core, a complex instruction set computing (CISC) core, a very long instruction word (VLIW) core, or a hybrid or alternative core type. As yet another option, the core 690 may be a special-purpose core, such as, for example, a network or communication core, compression engine, coprocessor core, general purpose computing graphics processing unit (GPGPU) core, graphics core, or the like.

The front end unit 630 includes a branch prediction unit 632 coupled to an instruction cache unit 634, which is coupled to an instruction translation lookaside buffer (TLB) 636, which is coupled to an instruction fetch unit 638, which is coupled to a decode unit 640. The decode unit 640 (or decoder) may decode instructions, and generate as an output one or more micro-operations, micro-code entry points, microinstructions, other instructions, or other control signals, which are decoded from, or which otherwise reflect, or are derived from, the original instructions. The decode unit 640 may be implemented using various different mechanisms. Examples of suitable mechanisms include, but are not limited to, look-up tables, hardware implementations, programmable logic arrays (PLAs), microcode read only memories (ROMs), etc. In one embodiment, the core 690 includes a microcode ROM or other medium that stores microcode for certain macroinstructions (e.g., in decode unit 640 or otherwise within the front end unit 630). The decode unit 640 is coupled to a rename/allocator unit 652 in the execution engine unit 650.

The execution engine unit 650 includes the rename/allocator unit 652 coupled to a retirement unit 654 and a set of one or more scheduler unit(s) 656. The scheduler unit(s) 656 represents any number of different schedulers, including reservations stations, central instruction window, etc. The scheduler unit(s) 656 is coupled to the physical register file(s) unit(s) 658. Each of the physical register file(s) units 658 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 658 comprises a vector registers unit, a write mask registers unit, and a scalar registers unit. These register units may provide architectural vector registers, vector mask registers, and general purpose registers. The physical register file(s) unit(s) 658 is overlapped by the retirement unit 654 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 654 and the physical register file(s) unit(s) 658 are coupled to the execution cluster(s) 660. The execution cluster(s) 660 includes a set of one or more execution units 662 and a set of one or more memory access units 664. The execution units 662 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 656, physical register file(s) unit(s) 658, and execution cluster(s) 660 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 664). It should also be understood that where separate pipelines are used, one or more of these pipelines may be out-of-order issue/execution and the rest in-order.

The set of memory access units 664 is coupled to the memory unit 670, which includes a data TLB unit 672 coupled to a data cache unit 674 coupled to a level 2 (L2) cache unit 676. In one exemplary embodiment, the memory access units 664 may include a load unit, a store address unit, and a store data unit, each of which is coupled to the data TLB unit 672 in the memory unit 670. The instruction cache unit 634 is further coupled to a level 2 (L2) cache unit 676 in the memory unit 670. The L2 cache unit 676 is coupled to one or more other levels of cache and eventually to a main memory.

By way of example, the exemplary register renaming, out-of-order issue/execution core architecture may implement the pipeline 600 as follows: 1) the instruction fetch 638 performs the fetch and length decoding stages 602 and 604; 2) the decode unit 640 performs the decode stage 606; 3) the rename/allocator unit 652 performs the allocation stage 608 and renaming stage 610; 4) the scheduler unit(s) 656 performs the schedule stage 612; 5) the physical register file(s) unit(s) 658 and the memory unit 670 perform the register read/memory read stage 614; the execution cluster 660 perform the execute stage 616; 6) the memory unit 670 and the physical register file(s) unit(s) 658 perform the write back/memory write stage 618; 7) various units may be involved in the exception handling stage 622; and 8) the retirement unit 654 and the physical register file(s) unit(s) 658 perform the commit stage 624.

The core 690 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 690 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 634/674 and a shared L2 cache unit 676, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Specific Exemplary in-Order Core Architecture

Figure 7B:
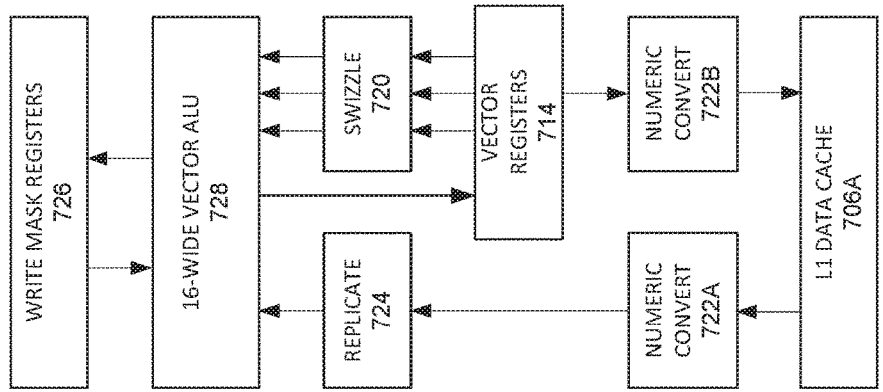
FIGS. 7A-B illustrate a block diagram of a more specific exemplary in-order core architecture, which core would be one of several logic blocks (including other cores of the same type and/or different types) in a chip.
Figure 7A:
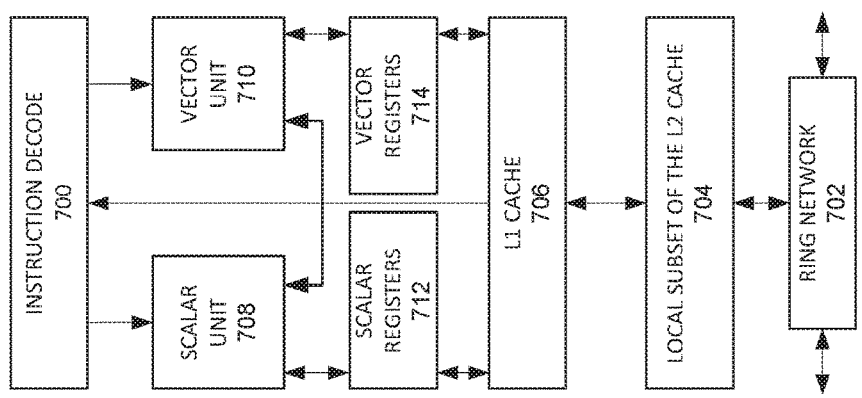

FIGS. 7A-B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 7A is a block diagram of a single processor core, along with its connection to the on-die interconnect network 702 and with its local subset of the Level 2 (L2) cache 704, according to embodiments of the invention. In one embodiment, an instruction decoder 700 supports the x86 instruction set with a packed data instruction set extension. An L1 cache 706 allows low-latency accesses to cache memory into the scalar and vector units. While in one embodiment (to simplify the design), a scalar unit 708 and a vector unit 710 use separate register sets (respectively, scalar registers 712 and vector registers 714) and data transferred between them is written to memory and then read back in from a level 1 (L1) cache 706, alternative embodiments of the invention may use a different approach (e.g., use a single register set or include a communication path that allow data to be transferred between the two register files without being written and read back).

The local subset of the L2 cache 704 is part of a global L2 cache that is divided into separate local subsets, one per processor core. Each processor core has a direct access path to its own local subset of the L2 cache 704. Data read by a processor core is stored in its L2 cache subset 704 and can be accessed quickly, in parallel with other processor cores accessing their own local L2 cache subsets. Data written by a processor core is stored in its own L2 cache subset 704 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 7B is an expanded view of part of the processor core in FIG. 7A according to embodiments of the invention. FIG. 7B includes an L1 data cache 706A part of the L1 cache 704, as well as more detail regarding the vector unit 710 and the vector registers 714. Specifically, the vector unit 710 is a 16-wide vector processing unit (VPU) (see the 16-wide ALU 728), which executes one or more of integer, single-precision float, and double-precision float instructions. The VPU supports swizzling the register inputs with swizzle unit 720, numeric conversion with numeric convert units 722A-B, and replication with replication unit 724 on the memory input. Write mask registers 726 allow predicating resulting vector writes.

Figure 8:
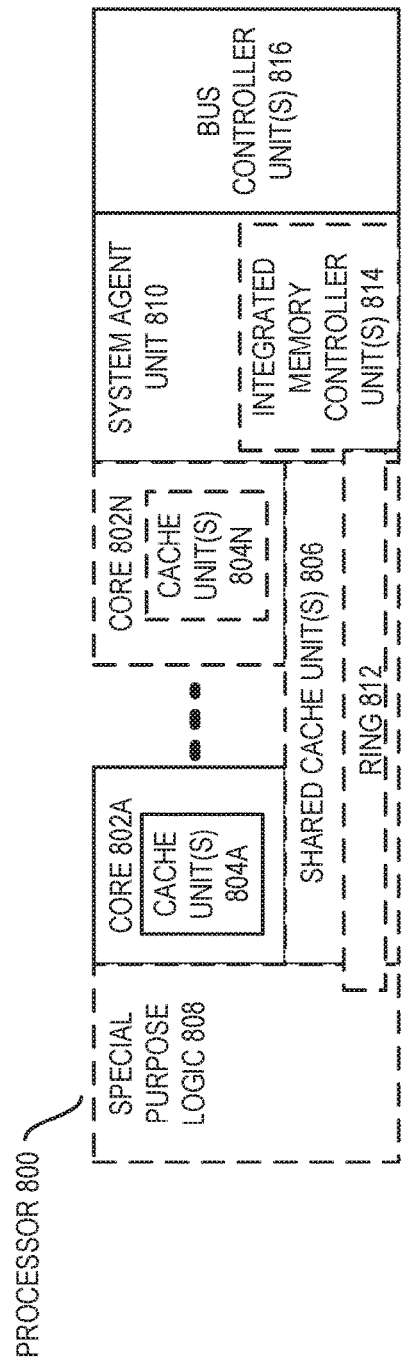
FIG. 8 is a block diagram of a processor that may have more than one core, may have an integrated memory controller, and may have integrated graphics according to embodiments of the invention.

FIG. 8 is a block diagram of a processor 800 that may have more than one core, may have an integrated memory controller, and may have integrated graphics according to embodiments of the invention. The solid lined boxes in FIG. 8 illustrate a processor 800 with a single core 802A, a system agent 810, a set of one or more bus controller units 816, while the optional addition of the dashed lined boxes illustrates an alternative processor 800 with multiple cores 802A-N, a set of one or more integrated memory controller unit(s) 814 in the system agent unit 810, and special purpose logic 808.

Thus, different implementations of the processor 800 may include: 1) a CPU with the special purpose logic 808 being integrated graphics and/or scientific (throughput) logic (which may include one or more cores), and the cores 802A-N being one or more general purpose cores (e.g., general purpose in-order cores, general purpose out-of-order cores, a combination of the two); 2) a coprocessor with the cores 802A-N being a large number of special purpose cores intended primarily for graphics and/or scientific (throughput); and 3) a coprocessor with the cores 802A-N being a large number of general purpose in-order cores. Thus, the processor 800 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 800 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 806, and external memory (not shown) coupled to the set of integrated memory controller units 814. The set of shared cache units 806 may include one or more mid-level caches, such as level 2 (L2), level 3 (L3), level 4 (L4), or other levels of cache, a last level cache (LLC), and/or combinations thereof. While in one embodiment a ring based interconnect unit 812 interconnects the integrated graphics logic 808, the set of shared cache units 806, and the system agent unit 810/integrated memory controller unit(s) 814, alternative embodiments may use any number of well-known techniques for interconnecting such units. In one embodiment, coherency is maintained between one or more cache units 806 and cores 802-A-N.

In some embodiments, one or more of the cores 802A-N are capable of multi-threading. The system agent 810 includes those components coordinating and operating cores 802A-N. The system agent unit 810 may include for example a power control unit (PCU) and a display unit. The PCU may be or include logic and components needed for regulating the power state of the cores 802A-N and the integrated graphics logic 808. The display unit is for driving one or more externally connected displays.

The cores 802A-N may be homogenous or heterogeneous in terms of architecture instruction set; that is, two or more of the cores 802A-N may be capable of execution the same instruction set, while others may be capable of executing only a subset of that instruction set or a different instruction set.

Exemplary Computer Architectures

FIGS. 9-12 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 9:
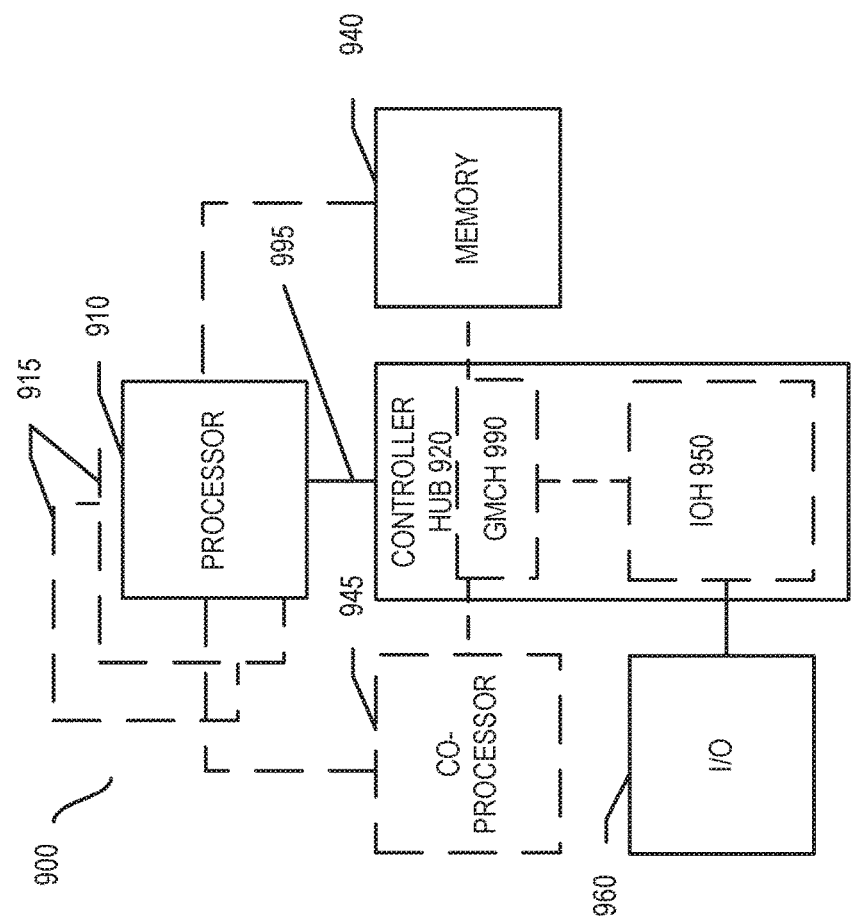
FIGS. 9-12 are block diagrams of exemplary computer architectures.

Referring now to FIG. 9, shown is a block diagram of a system 900 in accordance with one embodiment of the present invention. The system 900 may include one or more processors 910, 915, which are coupled to a controller hub 920. In one embodiment the controller hub 920 includes a graphics memory controller hub (GMCH) 990 and an Input/Output Hub (IOH) 950 (which may be on separate chips); the GMCH 990 includes memory and graphics controllers to which are coupled memory 940 and a coprocessor 945; the IOH 950 is couples input/output (I/O) devices 960 to the GMCH 990. Alternatively, one or both of the memory and graphics controllers are integrated within the processor (as described herein), the memory 940 and the coprocessor 945 are coupled directly to the processor 910, and the controller hub 920 in a single chip with the IOH 950.

The optional nature of additional processors 915 is denoted in FIG. 9 with broken lines. Each processor 910, 915 may include one or more of the processing cores described herein and may be some version of the processor 800.

The memory 940 may be, for example, dynamic random access memory (DRAM), phase change memory (PCM), or a combination of the two. For at least one embodiment, the controller hub 920 communicates with the processor(s) 910, 915 via a multi-drop bus, such as a frontside bus (FSB), point-to-point interface such as QuickPath Interconnect (QPI), or similar connection 995.

In one embodiment, the coprocessor 945 is a special-purpose processor, such as, for example, a high-throughput MIC processor, a network or communication processor, compression engine, graphics processor, GPGPU, embedded processor, or the like. In one embodiment, controller hub 920 may include an integrated graphics accelerator.

There can be a variety of differences between the physical resources 910, 915 in terms of a spectrum of metrics of merit including architectural, microarchitectural, thermal, power consumption characteristics, and the like.

In one embodiment, the processor 910 executes instructions that control data processing operations of a general type. Embedded within the instructions may be coprocessor instructions. The processor 910 recognizes these coprocessor instructions as being of a type that should be executed by the attached coprocessor 945. Accordingly, the processor 910 issues these coprocessor instructions (or control signals representing coprocessor instructions) on a coprocessor bus or other interconnect, to coprocessor 945. Coprocessor(s) 945 accept and execute the received coprocessor instructions.

Figure 10:
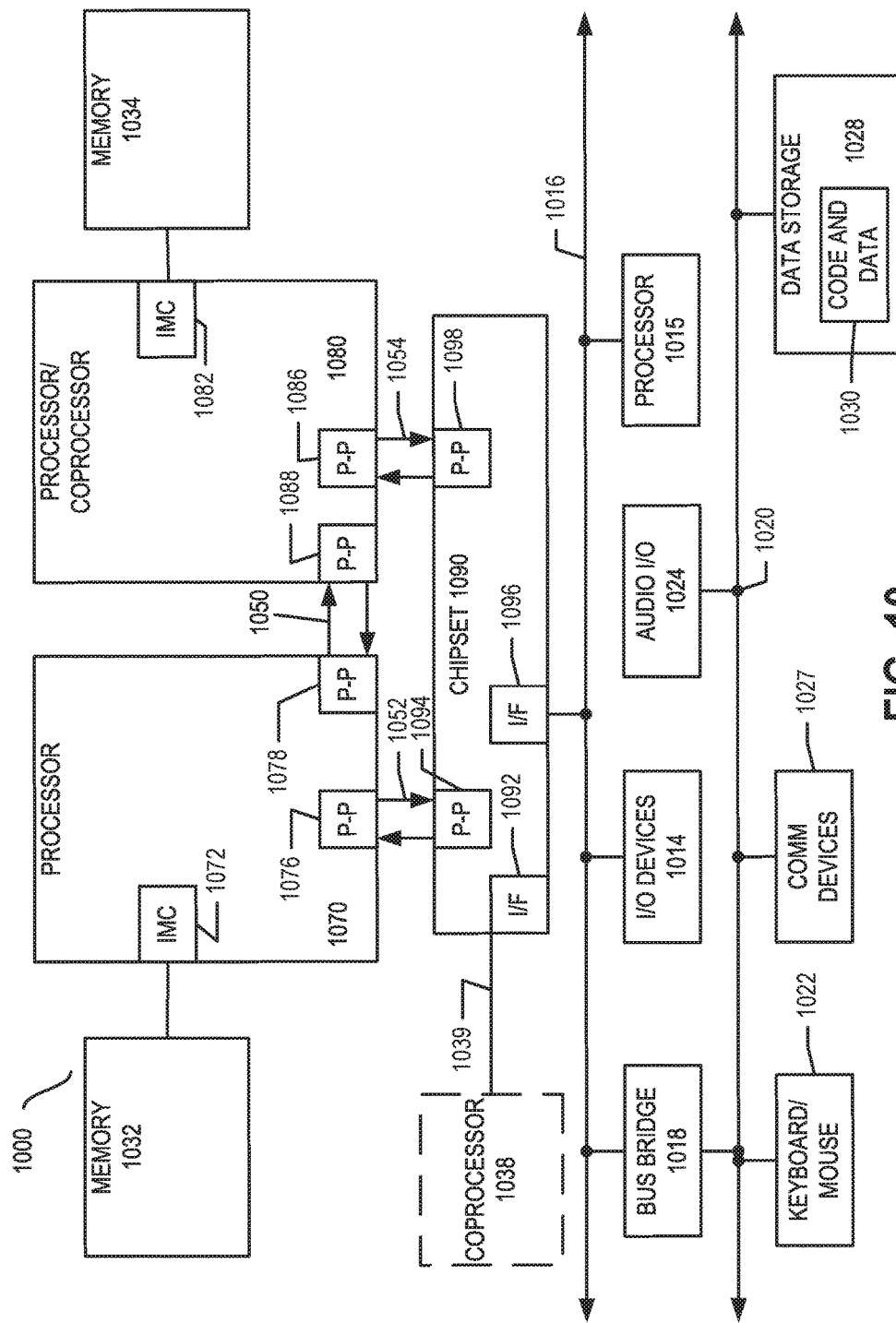

Referring now to FIG. 10, shown is a block diagram of a first more specific exemplary system 1000 in accordance with an embodiment of the present invention. As shown in FIG. 10, multiprocessor system 1000 is a point-to-point interconnect system, and includes a first processor 1070 and a second processor 1080 coupled via a point-to-point interconnect 1050. Each of processors 1070 and 1080 may be some version of the processor 800. In one embodiment of the invention, processors 1070 and 1080 are respectively processors 910 and 915, while coprocessor 1038 is coprocessor 945. In another embodiment, processors 1070 and 1080 are respectively processor 910 coprocessor 945.

Processors 1070 and 1080 are shown including integrated memory controller (IMC) units 1072 and 1082, respectively. Processor 1070 also includes as part of its bus controller units point-to-point (P-P) interfaces 1076 and 1078; similarly, second processor 1080 includes P-P interfaces 1086 and 1088. Processors 1070, 1080 may exchange information via a point-to-point (P-P) interface 1050 using P-P interface circuits 1078, 1088. As shown in FIG. 10, IMCs 1072 and 1082 couple the processors to respective memories, namely a memory 1032 and a memory 1034, which may be portions of main memory locally attached to the respective processors.

Processors 1070, 1080 may each exchange information with a chipset 1090 via individual P-P interfaces 1052, 1054 using point to point interface circuits 1076, 1094, 1086, 1098. Chipset 1090 may optionally exchange information with the coprocessor 1038 via a high-performance interface 1039. In one embodiment, the coprocessor 1038 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 1090 may be coupled to a first bus 1016 via an interface 1096. In one embodiment, first bus 1016 may be a Peripheral Component Interconnect (PCI) bus, or a bus such as a PCI Express bus or another third generation I/O interconnect bus, although the scope of the present invention is not so limited.

As shown in FIG. 10, various I/O devices 1014 may be coupled to first bus 1016, along with a bus bridge 1018 which couples first bus 1016 to a second bus 1020. In one embodiment, one or more additional processor(s) 1015, such as coprocessors, high-throughput MIC processors, GPGPU's, accelerators (such as, e.g., graphics accelerators or digital signal processing (DSP) units), field programmable gate arrays, or any other processor, are coupled to first bus 1016. In one embodiment, second bus 1020 may be a low pin count (LPC) bus. Various devices may be coupled to a second bus 1020 including, for example, a keyboard and/or mouse 1022, communication devices 1027 and a storage unit 1028 such as a disk drive or other mass storage device which may include instructions/code and data 1030, in one embodiment. Further, an audio I/O 1024 may be coupled to the second bus 1020. Note that other architectures are possible. For example, instead of the point-to-point architecture of FIG. 10, a system may implement a multi-drop bus or other such architecture.

Figure 11:
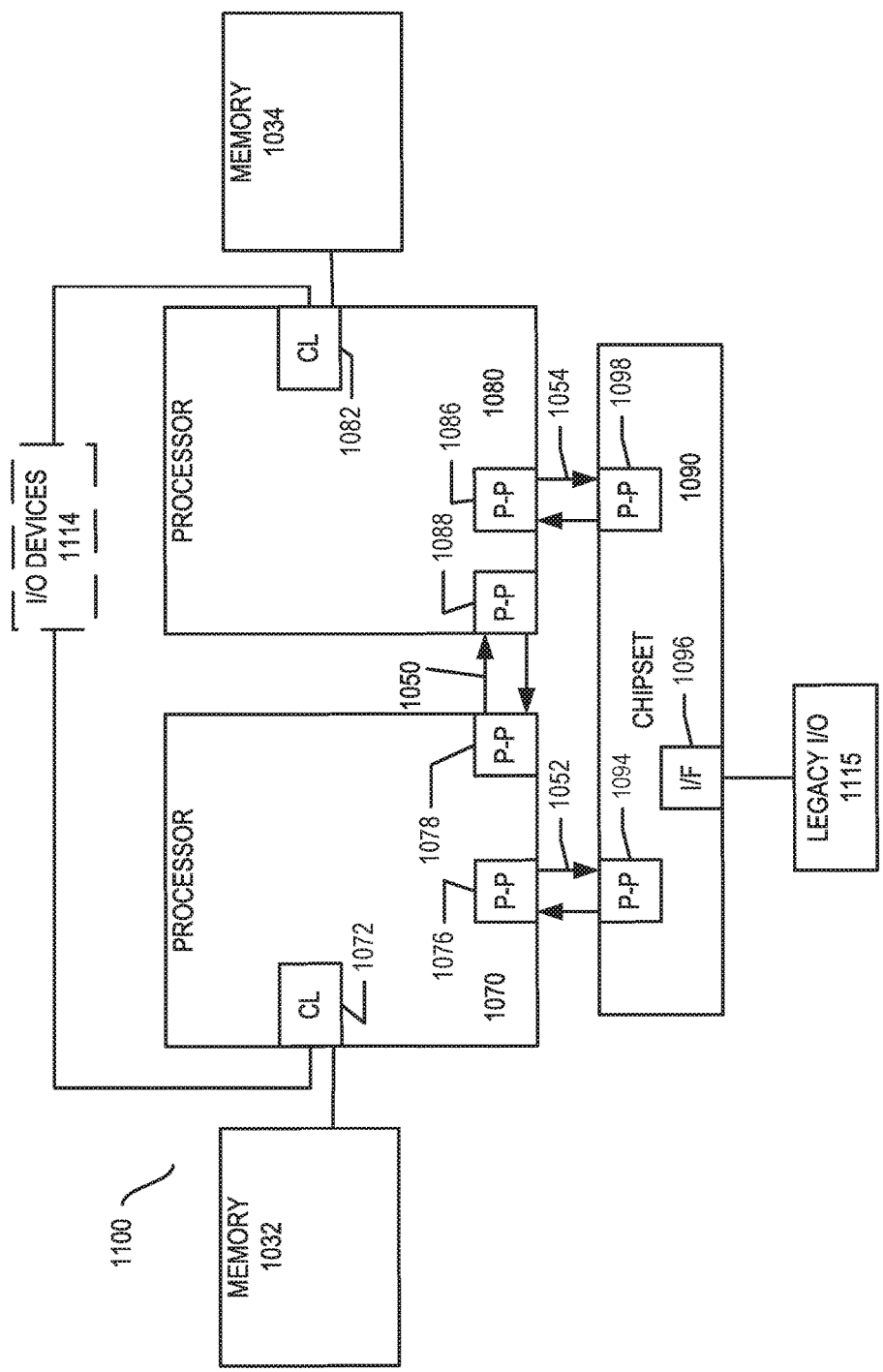

Referring now to FIG. 11, shown is a block diagram of a second more specific exemplary system 1100 in accordance with an embodiment of the present invention. Like elements in FIGS. 10 and 11 bear like reference numerals, and certain aspects of FIG. 10 have been omitted from FIG. 11 in order to avoid obscuring other aspects of FIG. 11.

FIG. 11 illustrates that the processors 1070, 1080 may include integrated memory and I/O control logic ("CL") 1072 and 1082, respectively. Thus, the CL 1072, 1082 include integrated memory controller units and include I/O control logic. FIG. 11 illustrates that not only are the memories 1032, 1034 coupled to the CL 1072, 1082, but also that I/O devices 1114 are also coupled to the control logic 1072, 1082. Legacy I/O devices 1115 are coupled to the chipset 1090.

Figure 12:
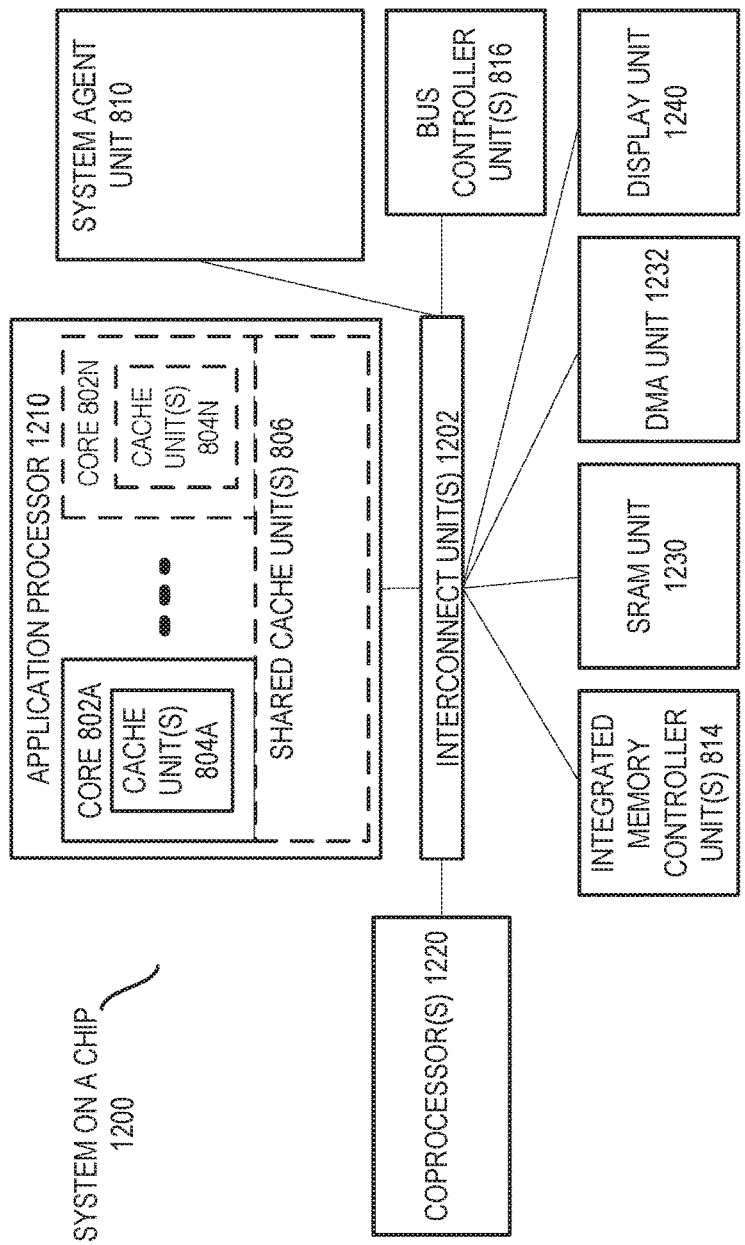

Referring now to FIG. 12, shown is a block diagram of a SoC 1200 in accordance with an embodiment of the present invention. Similar elements in FIG. 8 bear like reference numerals. Also, dashed lined boxes are optional features on more advanced SoCs. In FIG. 12, an interconnect unit(s) 1202 is coupled to: an application processor 1210 which includes a set of one or more cores 202A-N and shared cache unit(s) 806; a system agent unit 810; a bus controller unit(s) 816; an integrated memory controller unit(s) 814; a set or one or more coprocessors 1220 which may include integrated graphics logic, an image processor, an audio processor, and a video processor; an static random access memory (SRAM) unit 1230; a direct memory access (DMA) unit 1232; and a display unit 1240 for coupling to one or more external displays. In one embodiment, the coprocessor(s) 1220 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 1030 illustrated in FIG. 10, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation (Including Binary Translation, Code Morphing, Etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

FIG. 13 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 13 shows a program in a high level language 1302 may be compiled using an x86 compiler 1304 to generate x86 binary code 1306 that may be natively executed by a processor with at least one x86 instruction set core 1316. The processor with at least one x86 instruction set core 1316 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1304 represents a compiler that is operable to generate x86 binary code 1306 (e.g., object code) that can, with or without additional linkage processing, be executed on the processor with at least one x86 instruction set core 1316. Similarly, FIG. 13 shows the program in the high level language 1302 may be compiled using an alternative instruction set compiler 1308 to generate alternative instruction set binary code 1310 that may be natively executed by a processor without at least one x86 instruction set core 1314 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1312 is used to convert the x86 binary code 1306 into code that may be natively executed by the processor without an x86 instruction set core 1314. This converted code is not likely to be the same as the alternative instruction set binary code 1310 because an instruction converter capable of this is difficult to make; however, the converted code will accomplish the general operation and be made up of instructions from the alternative instruction set. Thus, the instruction converter 1312 represents software, firmware, hardware, or a combination thereof that, through emulation, simulation or any other process, allows a processor or other electronic device that does not have an x86 instruction set processor or core to execute the x86 binary code 1306.

The above description is intended to be illustrative, and not restrictive. For example, the above-described examples (or one or more aspects thereof) may be used in combination with others. Other embodiments may be used, such as by one of ordinary skill in the art upon reviewing the above description. The Abstract is to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. However, the claims may not set forth every feature disclosed herein as embodiments may feature a subset of said features. Further, embodiments may include fewer features than those disclosed in a particular example. Thus, the following claims are hereby incorporated into the Detailed Description, with a claim standing on its own as a separate embodiment. The scope of the embodiments disclosed herein is to be determined with reference to the appended claims, along with the full scope of equivalents to which such claims are entitled.

The invention claimed is:

1. An apparatus comprising:
   a hardware matcher circuit to:
      encode a preamble of data into a plurality of tokens, the data to include remainder data, each token to include a symbol and a length of the symbol; and
      generate symbol frequency statistics to indicate a number of times the symbol appears within the preamble of data;
   a Huffman table generator circuit to generate a Huffman code from the plurality of tokens and the symbol frequency statistics; and
   an encoder circuit to compress the remainder data using the Huffman code.

2. The apparatus of claim 1, the hardware matcher circuit to add a second plurality of tokens with a symbol frequency of one, the plurality of tokens and the second plurality of tokens to include all possible literals within the data.

3. The apparatus of claim 1, the Huffman table generator circuit to add a second plurality of tokens with a symbol frequency of one, the plurality of tokens and the second plurality of tokens to include all possible literals within the data.

4. The apparatus of claim 3, the encoder circuit to compress the preamble of data.

5. The apparatus of claim 3, further comprising:
   a buffer to store the plurality of tokens; and
   a transcoder to transcode the plurality of tokens using the Huffman codes, the encoder circuit to compress only the remainder data.

6. The apparatus of claim 1, a file to include a plurality of chunks of data, and wherein the data is one chunk of data.

7. The apparatus of claim 6, wherein each chunk of data is compressed.

8. The apparatus of claim 7, wherein at least two chunks of data are one megabyte in size.

9. The apparatus of claim 1, wherein the preamble of data is no more than 5% of a size of the data.

10. The apparatus of claim 9, wherein the preamble of data is 32 kilobytes.

11. The apparatus of claim 9, wherein the preamble of data is 64 kilobytes.

12. The apparatus of claim 9, wherein the preamble of data is 96 kilobytes.

13. A machine-implemented method comprising:
   encoding a preamble of data into a plurality of tokens, the data to include remainder data, each token to include a symbol and a length of the symbol;
   generating symbol frequency statistics to indicate a number of times the symbol appears within the preamble of data;
   generating a Huffman code from the plurality of tokens and the symbol frequency statistics; and
   compressing the remainder data using the Huffman code.

14. The method of claim 13, further comprising generating the Huffman codes from a second plurality of tokens with a symbol frequency of one, the plurality of tokens and the second plurality of tokens to include all possible literals within the data.

15. The method of claim 14, further comprising compressing the preamble of data.

16. The method of claim 14, further comprising:
   storing, in a buffer, the plurality of tokens;
   transcoding the plurality of tokens using the Huffman codes; and
   compressing only the remainder data.

17. The method of claim 13, a file to include a plurality of chunks of data, and wherein the data is one chunk of data.

18. The method of claim 17, wherein each chunk of data is compressed.

19. The method of claim 18, wherein at least two chunks of data are one megabyte in size.

20. The method of claim 17, wherein the preamble of data is no more than 5% of a size of the data.

21. At least one non-transitory computer-readable medium, including instructions, which when executed by a machine, cause the machine to perform operations:
   encoding a preamble of data into a plurality of tokens, the data to include remainder data, each token to include a symbol and a length of the symbol;
   generating symbol frequency statistics to indicate a number of times the symbol appears within the preamble of data;
   generating a Huffman code from the plurality of tokens and the symbol frequency statistics; and
   compressing the remainder data using the Huffman code.

22. The at least one computer-readable medium of claim 21, the operations further comprising generating the Huffman codes from a second plurality of tokens with a symbol frequency of one, the plurality of tokens and the second plurality of tokens to include all possible literals within the data.

23. The at least one computer-readable medium of claim 22, the operations further comprise compressing the preamble of data.

24. The at least one computer-readable medium of claim 22, the operations further comprising:
   storing, in a buffer, the plurality of tokens;
   transcoding the plurality of tokens using the Huffman codes; and
   compressing only the remainder data.

25. The at least one computer-readable medium of claim 21, wherein a file comprises a plurality of chunks of data, and wherein the data is one chunk of data.

* * * * *